(12) United States Patent
Panchou et al.

(10) Patent No.: US 6,184,463 B1
(45) Date of Patent: *Feb. 6, 2001

(54) INTEGRATED CIRCUIT PACKAGE FOR FLIP CHIP

(75) Inventors: Karen A. Panchou, Grant; Charles M. Newton, Palm Bay, both of FL (US)

(73) Assignee: Harris Corporation, Palm Bay, FL (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/059,080

(22) Filed: Apr. 13, 1998

(51) Int. Cl.[7] .................................................... H01L 23/02
(52) U.S. Cl. .......................... 174/52.4; 257/724; 257/778
(58) Field of Search ................................ 174/52.2, 52.3, 174/52.4; 257/693, 723, 724, 778

(56) References Cited

U.S. PATENT DOCUMENTS

| | | | |
|---|---|---|---|
| 3,745,505 | * 7/1973 | Turnbull et al. | 338/20 |
| 3,777,221 | 12/1973 | Tatusko et al. | |
| 4,577,214 | * 3/1986 | Schaper | 357/74 |
| 4,862,323 | * 8/1989 | Butt | 361/388 |
| 5,019,673 | * 5/1991 | Juskey et al. | 174/52.2 |
| 5,081,563 | 1/1992 | Feng et al. | |
| 5,134,246 | 7/1992 | Beppu et al. | |
| 5,196,089 | * 3/1993 | Takada et al. | 156/645 |
| 5,258,575 | 11/1993 | Beppu et al. | |
| 5,371,404 | * 12/1994 | Juskey et al. | 257/659 |
| 5,438,224 | * 8/1995 | Papageorge et al. | 257/777 |
| 5,461,197 | 10/1995 | Hiruta et al. | |
| 5,488,542 | 1/1996 | Ito | |
| 5,545,924 | * 8/1996 | Contolatis et al. | 257/724 |
| 5,589,781 | * 12/1996 | Higgins et al. | 324/755 |
| 5,635,761 | 6/1997 | Cao et al. | |
| 5,663,593 | 9/1997 | Mostafazadeh et al. | |
| 5,811,879 | * 9/1998 | Akram | 257/723 |
| 5,815,372 | * 9/1998 | Gallas | 361/760 |
| 5,854,534 | * 12/1998 | Beilin et al. | 257/691 |
| 5,925,934 | * 7/1999 | Lim | 257/778 |
| 5,940,687 | * 8/1999 | Davis et al. | 438/118 |
| 6,087,732 | * 7/2000 | Chittipeddi et al. | 257/786 |

* cited by examiner

Primary Examiner—Kristine Kincaid
Assistant Examiner—W. David Walkenhorst
(74) Attorney, Agent, or Firm—Allen, Dyer, Doppelt, Milbrath & Gilchrist, P.A.

(57) ABSTRACT

An integrated circuit package includes a ceramic substrate having a cut out configured to receive a flip chip. The cut out includes vias formed as through holes. A flip chip is received within the cut out of the ceramic substrate and has conductive bumps formed thereon corresponding to the electrical input/output contacts of the flip chip. The conductive bumps are received within the through holes of the ceramic substrate. A second integrated circuit chip is mounted on the flip chip in back-to-back relationship. A controlled impedance line is secured to the conductive bumps and acts as a coax. In another aspect of the present invention, a heat sink can be mounted on the back of the flip chip, and the second integrated circuit chip mounted on the heat sink.

13 Claims, 1 Drawing Sheet

INTEGRATED CIRCUIT PACKAGE FOR FLIP CHIP

FIELD OF THE INVENTION

This invention relates to an integrated circuit package for flip chips and, more particularly, to an integrated circuit package and method of forming the integrated circuit package using a ceramic substrate for receiving a flip chip.

BACKGROUND OF THE INVENTION

Large scale integrated circuit chips have many input and output connections. In order to accommodate the many connections, manufacturers have produced leadless chip carriers that use a wire bonding process. However, a wire bonding process can be expensive. In order to reduce the complexity and expense of a wire bonding process, manufacturers have increasingly used flip chip technology.

In a flip chip, an integrated circuit carries a pad arrangement on the top surface and is turned upside down (i.e., flipped), thus allowing direct coupling between the pads and matching contacts on the main circuit board or chip carrier. In a typical flip chip, solder or gold bumps are formed on the integrated circuit input/output terminals. The flip chip is directly bonded to a chip carrier or other structure by a solder connection.

U.S. Pat. No. 5,019,673 to Juskey, et al. discloses a flip chip package for integrated circuits that allows flip chip removal for ready testing and/or replacement. In the '673 patent, a flip chip package includes an over-molding of an integrated circuit assembly. A flip chip is mounted to a thin chip carrier. The flip chip includes an array of bumped pads, which fill an array of matching conductive through holes on the chip carrier. The chip carrier includes an array of bumped contacts on its back surface, which corresponds to bumped pads of the flip chip. The transfer over-molding of the integrated circuit assembly provides a layer of epoxy around the exposed surfaces of the flip chip, thus allowing an environmentally protected and removable integrated circuit package.

Although the structure does provide a removable flip chip package, processing requirements, such as microwave systems, require even greater space saving structures and manufacturing techniques that are efficient and low cost. The requirements for increased miniaturization of low volume and proprietary systems has generated a need for increased density of active devices, such as flip chips. A process for implementing flip chip packaging on a die, such as a mimic die, is not available because of grounding difficulties. This is seen especially with galium arsenide devices having an air bridge. It is also difficult to under fill these types of flip chips because of the shorting problems. Additionally, these types of chips also require grounding on the back side.

SUMMARY OF THE INVENTION

It is, therefore, an object of the present invention to provide an integrated circuit package and method of forming same that allows flip chip packaging such that dies can be mounted in a relationship for same space packaging and increased density.

In accordance with the present invention, an integrated circuit package includes a ceramic substrate having a cut out configured to receive a flip chip. The cut out includes vias forming through holes. A flip chip is received within the cut out of the ceramic substrate and has conductive bumps formed thereon corresponding to the electrical contact pads of the flip chip. The conductive bumps are received within the through holes in the ceramic substrate. The through holes are also plated with a conductive ink. A controlled impedance line is secured to the conductive bumps by adhesive means, such as conductive epoxy, and acts as a simulated coax.

A second integrated circuit chip is mounted back-to-back on the flip chip received within the cut out. The flip chip and second integrated circuit chip are grounded together, such as by conductive epoxy. In accordance with one aspect of the present invention, the flip chip and second integrated circuit chip are stepped in configuration. Conductive bumps are formed as epoxy having a conductive material impregnated therein.

In still another aspect of the present invention, the integrated circuit package comprises a ceramic substrate having a cut out, which includes through holes. A flip chip is received within the cut out of the ceramic substrate and has conductive bumps formed thereon which are received through the through holes of the ceramic substrate. A heat sink is mounted on the flip chip. A second integrated circuit can be mounted on the heat sink and the second integrated circuit and can be electrically connected to conductive patterns formed on the ceramic substrate. The second integrated circuit is also grounded to the flip chip.

In a method aspect of the present invention for forming an integrated circuit package, the steps comprise forming a ceramic substrate having a cut out configured to receive a flip chip wherein the cut out includes through holes. The method further comprises forming conductive bumps onto a flip chip that correspond to the electrical input/output contacts of the flip chip, and receiving the flip chip within the cut out of the ceramic substrate so that the conductive bumps are received within the through holes of the ceramic substrate. The method also includes securing a controlled impedance line to the conductive bumps. In still another aspect of the present invention, the method comprises mounting a second integrated circuit chip on the flip chip in back-to-back relationship and grounding together the flip chip and second integrated circuit chip, such as by an adhesive epoxy. The method can further comprise mounting a heat sink on the flip chip followed by mounting a second integrated circuit chip on the heat sink.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention now provides an integrated circuit package, illustrated generally at 5, and a method of forming the integrated circuit package that allows for back side grounding of a flip chip and similar mimics and provides an integrated circuit package for "same space" packaging, if flip chips. This packaging feature of the present invention can be applied to a phased array component level assembly. It allows increased miniaturization of low volume and proprietary systems and allows increased density of active devices, such as flip chips.

This process for implementing flip chip packaging on a mimic die has not been currently available because of grounding difficulties between two chips. The present invention now allows back-to-back flip chip packaging with grounding. Excessive wire bonds are also eliminated to provide increased performance and repeatability. The integrated circuit package and method of forming the package is especially relevant for Galium Arsenide devices. These type of devices typically have air bridges, thus preventing flip chips from being placed on their face, which could cause shorts. These Galium Arsenide chips also must be grounded on the back side. Thus, the present invention allows not only back side grounding, but also allows for back-to-back grounding of two chips, thus allowing a space saving of 30% to 50%.

Figure 1:
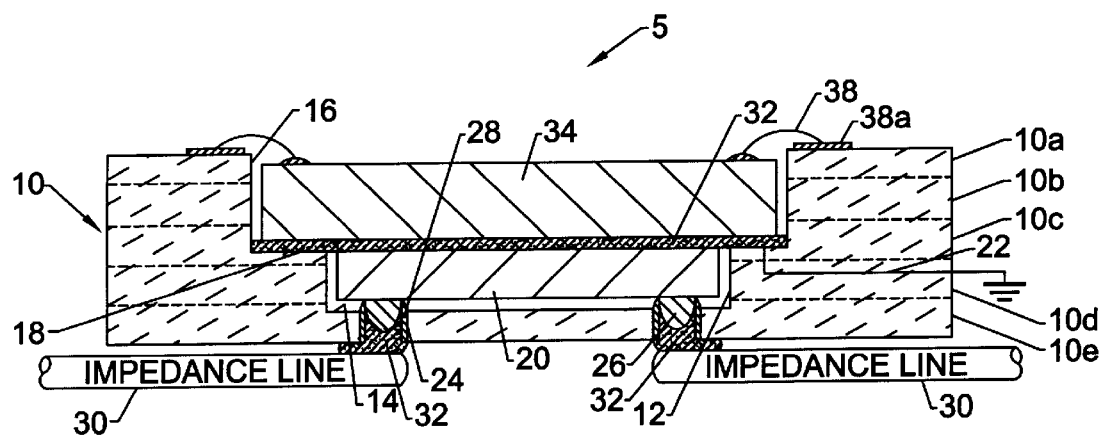
FIG. 1 is a schematic sectional view of a flip chip and second integrated circuit chip formed as a silicon die received within the ceramic substrate in back-to-back relationship, and showing a controlled impedance line that simulates coax when connected to conductive bumps of the flip chip.

Referring now to FIG. 1, there is illustrated a ceramic substrate 10 that has been formed in a stepped configuration having a first cut out 12 and first ledge 14, followed by larger cut out 16 and second ledge 18 to receive a Galium Arsenide chip configured as a flip chip 20. The ceramic substrate 10 is typically formed in its green state by stacking together layers 10*a–e* of green tape, which in the green state can be easily formed before it is hardened by heating. Typically, the green tape is about three mil thickness.

As is well known to those skilled in the art, the green tape ceramic has metallized conductive patterns 22 formed thereon, forming signal paths, such as the grounding signal path on layer 10*d*. Such patterns 22 can be formed by silk screening or other techniques known to those skilled in the art. Once the metallized conductive patterns 22 are formed on the green tape ceramic sheets, the sheets are stacked together forming the desired ceramic substrate. The type of ceramic substrate used by the present invention is well known to those skilled in the art.

The ceramic substrate has a cut out 12 that allows a flip chip to be received within the cut out, and a second cut out 16 for a heat sink or second integrated circuit chip. The cut out includes vias formed as through holes 24. The cut outs 12,16 can be formed by processing techniques known to those skilled in the art. The cut out 12 is dimensioned to receive the flip chip (also referred to as a mimic chip).

In accordance with the present invention, the flip chip 20 has conductive bumps 26 formed thereon corresponding to the electrical input/output contacts of the flip chip. The conductive bumps 26 can be formed, such as by bumping using gold (Au) wire. It is also possible to form the conductive bumps using an epoxy having a conductive material (such as silver powder) impregnated throughout the epoxy to form conductive bumps.

The through holes 24 are also plated with a conductive ink 28 to allow ready conduction. As shown in FIG. 1, the flip chip is received within the first cut out 12 and the conductive bumps are received in the through holes 24. Control impedance lines 30, which in effect simulate coax, are secured by conductive epoxy 32 to the conductive bumps 26.

A second integrated circuit chip 34 (also a flip chip in the illustrated example) is mounted back-to-back on top of the flip chip 20. This second integrated circuit chip 34 can be secured by a conductive epoxy 32 to allow back-to-back grounding of both chips, via conductive grounded patterns that had previously been formed on the green tape ceramic. Wire bonds 38 can connect the second integrated circuit chip to a conductive pattern 38*a* that has been formed on the ceramic substrate, such as by silk screening as noted before.

Figure 2:
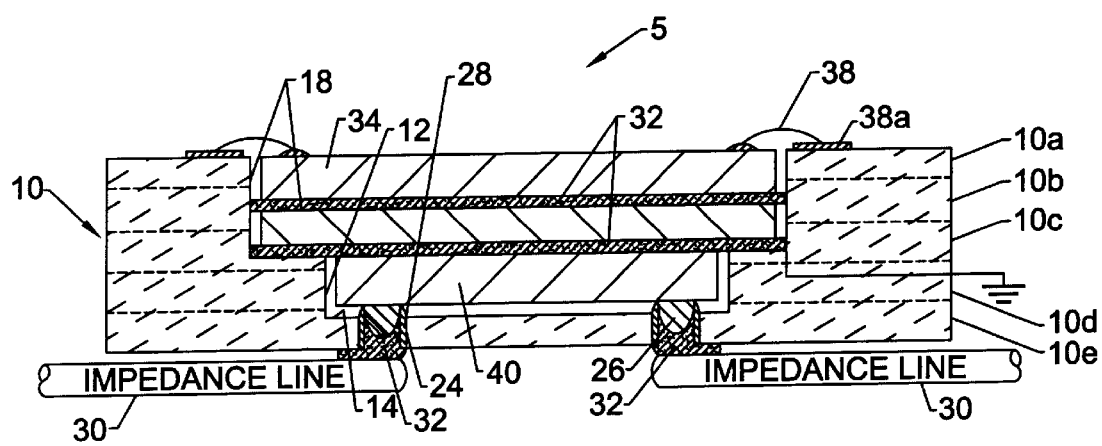
FIG. 2 is another sectional view of a flip chip having a heat sink received on the flip chip, and received within a ceramic substrate.

In the embodiment shown in FIG. 2, instead of a conductive epoxy situated between the second integrated circuit chip and the flip chip, a copper or copper/tungsten heat sink 40 (or other suitably formed heat sink) has been mounted on top of the flip chip 20.

The second integrated circuit chip 34 is mounted on the heat sink 40. A conductive epoxy 32 can be used to secure the flip chip, heat sink, and second integrated circuit chip, and allow back-to-back grounding as explained before. It is also possible for the heat sink 40 to be grounded, such as by wire bonds. This is advantageous if a second integrated circuit chip is not mounted on top of the heat sink.

In accordance with a method aspect of the present invention, the integrated circuit package 5 is formed by techniques known to those skilled in the art. In the present invention, a green tape ceramic (formed as three mil sheets, which can be stacked) is cut out. Holes are drilled into the green tape ceramic forming the vias or through holes 24. A laser or other drilling means known to those skilled in the art can be used. The through holes 24 are plated with conductive material, such as a conductive ink 28. At the same time, a layer of conductive circuitry is formed on the green tape ceramic such as by screen printing on the green tape ceramic with techniques known to those skilled in the art. The green tape ceramic is also cut to later form the desired cut outs 12,16 to receive the flip chip 20 and other associated components, such as second integrated circuit chip 34. Different layers of green tape ceramic are then pressed together to form the stepped configuration as illustrated in FIGS. 1 and 2. The applied circuit patterns can include ground layers in any desired position as desired by one skilled in the art.

The flip chip, such as the desired Galium Arsenide chip, has gold ball bumps formed on the die as conductive bumps 26, by gold wire application, and flattened with a tamping tool. The gold gall bumps correspond to electrical input/output contacts and are positioned to the align with holes formed in the green tape ceramic. The flip chip die acts as a mimic die and is pressed into the green tape ceramic so that the gold ball bumps extend through the formed through holes. An adhesive, such as a conductive epoxy 32, is then placed onto the hole and gold ball bump and a controlled impedance line secured by the conductive epoxy to the gold ball bumps. Thus, there is no lead line for the wire bonds that could cause noise and other problems. This controlled impedance line simulates a coax. As illustrated in FIG. 1, the cut out is stepped to allow another die to mount back-to-back.

A conductive epoxy 32 is placed on the back side and establishes the ground for the flip chip 20, and in some instances, for the second integrated circuit chip. As shown in FIG. 1, the second integrated circuit chip 34 is placed back-to-back to the flip chip and can be wire bonded to the conductive patterns formed on the green tape ceramic.

FIG. 2 illustrates an embodiment where a heat sink 34, such as a copper or copper/tungsten heat sink, is placed on top of the flip chip 20. The second integrated circuit chip can be placed on top of the heat sink. As described before, the conductive epoxy can secure the flip chip, heat sink and the second integrated circuit chip.

The present invention now allows for increased miniaturization and eliminates a multiplicity of wire bonds, while also allowing for flip chip packaging on a mimic die. Thus, greater flip chip density can be realized, while saving costs.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. An integrated circuit package comprising:
    a ceramic substrate having opposing upper and lower sides and formed from a plurality of stacked ceramic layers having a cut out configured to receive a flip chip, said cut out including through holes extending through to the lower side of said ceramic substrate, wherein one of said stacked ceramic layers includes a metallized conductive pattern forming a grounding signal path located substantially medially within the ceramic substrate;
    a gallium arsenide integrated circuit flip chip received within the cut out of the ceramic substrate and having conductive bumps formed thereon corresponding to the electrical input/output contacts of the flip chip, wherein the conductive bumps extend downward and are received within the through holes of the ceramic substrate;
    a controlled impedance line secured to the conductive bumps;
    a second integrated circuit chip mounted back-to-back on the flip chip received within the cut out, a conductive epoxy positioned between the flip chip and second integrated circuit chip and securing said chips to each other, wherein said conductive epoxy is connected to said grounding signal path for back-to-back grounding of said flip chip and second integrated circuit chip, said second integrated circuit chip including electrical contacts that are upward in direction; and
    a conductive pattern positioned on said upper side of said ceramic substrate and connected to said electrical contacts on said second integrated circuit chip.

2. A package according to claim 1, wherein said conductive bumps are formed from gold.

3. A package according to claim 1, and further comprising a conductive ink plated on the through holes.

4. A package according to claim 1, and further comprising a means for adhesively securing said controlled impedance line to the conductive bumps.

5. A package according to claim 1, and further comprising a second stepped cut out for receiving the second integrated circuit chip.

6. A package according to claim 1, wherein said conductive bumps are formed of epoxy having a conductive material impregnated therein.

7. An integrated circuit package comprising:
    a ceramic substrate having opposing upper and lower sides and formed from a plurality of stacked ceramic layers and having conductive patterns formed on the upper side thereon, and a cut out configured to receive a flip chip, said cut out including through holes extending through to the lower side of said ceramic substrate, and a metallized conductive pattern located substantially medially within the ceramic substrate and on one of said stacked ceramic layers and forming a grounding signal path
    a gallium arsenide integrated circuit flip chip received within the cut out of the ceramic substrate and having conductive bumps formed thereon corresponding to the electrical input/output contacts of the flip chip, wherein the conductive bumps are downward received within the through holes of the ceramic substrate;
    a controlled impedance line secured to the conductive bumps;
    an electrically conductive heat sink mounted on the flip chip;
    a second integrated circuit chip mounted on the heat sink in back-to-back relationship to the flip chip, and including electrical contacts, such that the electrical contacts of the second integrated circuit chip are upward in direction, wherein said flip chip and second integrated circuit chip are adhesively secured to said electrically conductive heat sink by an electrically conductive adhesive to allow back-to-back grounding, and wherein said conductive epoxy is connected to said grounding signal path for back-to-back grounding of said flip chip and said second integrated circuit chip; and
    means for electrically connecting the electrical contacts of the second integrated circuit to said conductive patterns formed on the upper side of the ceramic substrate.

8. A package according to claim 7, wherein said conductive bumps are formed from gold.

9. A package according to claim 7, and further comprising a conductive ink plated on the through holes.

10. A package according to claim 7, and further comprising a controlled impedance line secured to the conductive bumps.

11. A package according to claim 7, and further comprising a stepped cut out formed in the ceramic substrate for receiving the flip chip and the second integrated circuit chip.

12. A package according to claim 7, wherein said conductive bumps are formed as epoxy having a conductive material impregnated therein.

13. A package according to claim 7, and further comprising a conductive epoxy that secures together the flip chip, heat sink and second integrated circuit.

* * * * *